(12) United States Patent
Schmidt et al.

(10) Patent No.: US 10,023,796 B2
(45) Date of Patent: Jul. 17, 2018

(54) ILLUMINATION SYSTEM COMPRISING COMPOSITE MONOLITHIC CERAMIC LUMINESCENCE CONVERTER

(75) Inventors: Peter J. Schmidt, Aachen (DE); Lucas Johannes Anna Maria Beckers, Veldhoven (NL); Joerg Meyer, Aachen (DE); Baby-Seriyati Schreinemacher, Eynatten (BE); Herbert Schreinemacher, Baesweiler (DE)

(73) Assignee: Lumileds LLC, San Jose, CA (US)

( * ) Notice: Subject to any disclaimer, the term of this patent is extended or adjusted under 35 U.S.C. 154(b) by 1629 days.

(21) Appl. No.: 12/525,085

(22) PCT Filed: Jan. 31, 2008

(86) PCT No.: PCT/IB2008/050362
§ 371 (c)(1),
(2), (4) Date: Feb. 2, 2010

(87) PCT Pub. No.: WO2008/096301
PCT Pub. Date: Aug. 14, 2008

(65) Prior Publication Data
US 2010/0142181 A1    Jun. 10, 2010

(30) Foreign Application Priority Data
Feb. 7, 2007 (EP) .................................... 07101898

(51) Int. Cl.
*C09K 11/56* (2006.01)
*C09K 11/77* (2006.01)
(Continued)

(52) U.S. Cl.
CPC ........ *C09K 11/7734* (2013.01); *C04B 35/593* (2013.01); *C04B 35/597* (2013.01);
(Continued)

(58) Field of Classification Search
None
See application file for complete search history.

(56) References Cited

U.S. PATENT DOCUMENTS 5,175,132 A * 12/1992 Ketcham et al. ............. 501/103
6,682,663 B2    1/2004 Botty et al.
(Continued)

FOREIGN PATENT DOCUMENTS

DE    10349038 A1    5/2004
JP    H1017396 A    1/1998
(Continued)

OTHER PUBLICATIONS

Definition of "monolithic." (The American Heritage Dictionary, 5$^{th}$ ed., 2015).*

(Continued)

*Primary Examiner* — J. L. Yang

(57) ABSTRACT

An illumination system comprising a radiation source and a monolithic ceramic luminescence converter comprising a composite material of at least one luminescent compound, and at least one non-luminescent compound, wherein the material of the non-luminescent compound comprises silicon and nitrogen, is advantageously used, when the luminescent compound comprises an rare-earth metal-activated host compound also comprising silicon and nitrogen. Shared chemical characteristics of the luminescent compound and the non-luminescent material improve phase assemblage, thermal and optical behavior. The invention relates also to a composite monolithic ceramic luminescence converter.

30 Claims, 3 Drawing Sheets

(51) Int. Cl.
  *C04B 35/593*  (2006.01)
  *C04B 35/597*  (2006.01)
  *C04B 35/626*  (2006.01)
  *C04B 35/645*  (2006.01)
  *C09K 11/08*   (2006.01)
  *H01L 33/50*   (2010.01)

(52) U.S. Cl.
  CPC ...... *C04B 35/6262* (2013.01); *C04B 35/6265* (2013.01); *C04B 35/6268* (2013.01); *C04B 35/62685* (2013.01); *C04B 35/645* (2013.01); *C09K 11/0883* (2013.01); *C09K 11/7706* (2013.01); *C04B 2235/3208* (2013.01); *C04B 2235/3213* (2013.01); *C04B 2235/3215* (2013.01); *C04B 2235/3224* (2013.01); *C04B 2235/3865* (2013.01); *C04B 2235/3873* (2013.01); *C04B 2235/442* (2013.01); *C04B 2235/5436* (2013.01); *C04B 2235/652* (2013.01); *C04B 2235/658* (2013.01); *C04B 2235/6582* (2013.01); *C04B 2235/662* (2013.01); *C04B 2235/77* (2013.01); *C04B 2235/786* (2013.01); *C04B 2235/80* (2013.01); *C04B 2235/9653* (2013.01); *H01L 33/502* (2013.01); *H01L 2224/13* (2013.01); *H01L 2224/73253* (2013.01); *H01L 2924/00014* (2013.01); *H01L 2924/12044* (2013.01)

(56) References Cited

U.S. PATENT DOCUMENTS

| | | | |
|---|---|---|---|
| 7,901,592 B2 * | 3/2011 | Schmidt et al. | 252/301.4 F |
| 2004/0135504 A1 * | 7/2004 | Tamaki et al. | 313/512 |
| 2006/0001352 A1 * | 1/2006 | Maruta | C09K 11/0883 313/486 |
| 2008/0165523 A1 * | 7/2008 | Schmidt et al. | 362/84 |

FOREIGN PATENT DOCUMENTS

| | | | |
|---|---|---|---|
| JP | 2004146835 A | 5/2004 | |
| JP | 2005175039 A | 6/2005 | |
| JP | 2006169526 A | 6/2006 | |
| JP | 2010509764 A | 3/2010 | |
| WO | WO-2004/042834 A1 * | 5/2004 | |
| WO | 2005049763 A1 | 6/2005 | |
| WO | 2005119797 A1 | 12/2005 | |
| WO | 2006013513 A1 | 2/2006 | |
| WO | 2006035353 | 4/2006 | |
| WO | 2006043719 A1 | 4/2006 | |
| WO | 2006072918 A1 | 7/2006 | |
| WO | WO-2006072918 A1 * | 7/2006 | ............. C09K 11/79 |
| WO | 2006087660 A1 | 8/2006 | |
| WO | 2006087661 A1 | 8/2006 | |
| WO | 2006097876 A1 | 9/2006 | |
| WO | 2006106883 A1 | 10/2006 | |
| WO | 2006111906 A2 | 10/2006 | |
| WO | 2006111907 | 10/2006 | |

OTHER PUBLICATIONS

EPO as ISA, PCTIB2008/050362 filed Jan. 31, 2008, "International Search Report and Written Opinion" dated May 27, 2008, 16 pages.
Notification to Grant, China Application No. 200880004472.7, dated Sep. 5, 2012, 4 pages.
Office Action, China Application No. 200880004472.7, dated Mar. 31, 2012, 11 pages.
Office Action, EP Application No. 08709941.2, dated Oct. 7, 2010, 3 pages.
Office Action, JP Application No. 09-548775, dated Aug. 27, 2012, 3 pages.
Office Action, JP Application No. 09-548775, dated Jun. 5, 2013, 3 pages.
Office Action, JP Application No. 09-548775, dated Nov. 20, 2013, 2 pages.
Office Action, JP Application No. 09-548775, dated May 28, 2014, 3 pages.
Office Action, JP Application No. 09-548775, dated Aug. 27, 2012, 8 pages.
Office Action, JP Application No. 09-548775, dated Jun. 5, 2013, 7 pages.
Office Action, JP Application No. 09-548775, dated Nov. 20, 2013, 5 pages.
Office Action, JP Application No. 09-548775, dated May 28, 2014, 6 pages.

* cited by examiner $Ba_{1-x}Sr_xSi_7N_{10}$   $Ba_{2-x}Sr_xSi_5N_8$

ILLUMINATION SYSTEM COMPRISING COMPOSITE MONOLITHIC CERAMIC LUMINESCENCE CONVERTER

FIELD OF THE INVENTION

The invention relates to an illumination system comprising a radiation source and a composite monolithic ceramic luminescence converter comprising at least one luminescent compound and at least one non-luminescent compound. Preferably, the radiation source is a light emitting diode.

BACKGROUND TO THE INVENTION

It is known in the art that white or colored light illumination can be provided by an illumination system, wherein the radiation of a light emitting diode is converted by a phosphor. The light-emitting diode excites the phosphor, which thereupon emits at longer wavelength range; the combined emissions produce white or colored light.

As recent advances in light-emitting diode technology have brought very efficient light emitting diodes emitting in the near UV to blue range, today a variety of colored and white-light emitting phosphor-converted light emitting diodes are on the market, challenging traditional incandescent and fluorescent lighting.

The conventional phosphor converted light emitting device (pc-LED) typically utilizes a design in which a semiconductor chip having a blue-emitting LED thereon is covered by a layer of epoxy resin containing phosphor particles powders of one or more phosphors.

In a more recent approach, the semiconductor chip is covered by a layer of particles of one or more phosphors, which are deposited by an electrophoretic deposition technology (EPD). Such technology provides phosphor layers that are thinner than the resin-bonded phosphor layers. This allows for better chromaticity control and improved luminance.

However, a problem in prior art illumination systems comprising phosphor particle powders is that they cannot be used for many applications because they have a number of drawbacks:

Firstly, the deposition of a phosphor particle layer of uniform thickness is difficult. The phosphor particles tend to agglomerate, and hence, providing a uniform phosphor layer with particles of a known grain size is difficult. As color uniformity requires a uniform layer thickness, color uniformity is difficult to guarantee.

Secondly, conventional phosphor particles are polycrystalline powders. However, polycrystalline phosphor powder layers tend to have a low transmission due to scattering. The polycrystalline phosphor powder particles absorb scattered light that is not re-emitted, which lowers the light output. In addition, backscattering of light emitted by the LED leads to absorption losses in chip, which is relatively absorptive, leading to lower light-extraction efficiency.

WO2006/097876 discloses a light-emitting element provided with a light-emitting diode and monolithic polycrystalline ceramic structure, wherein a phosphor of the YAG-type is embedded in a ceramic matrix comprising non-luminescent polycrystalline alumina.

Embedding a luminescent compound in a ceramic matrix comprising a non-luminescent compound improves the optical characteristics of the luminescence converter and facilitates thermal management of the device.

Yet the non-luminescent polycrystalline alumina matrix material of the prior art is a material that has chemical characteristics, which are very valuable, if used in combination with a phosphor of the YAG garnet type, but may be less favorable in combination with other phosphors.

It is therefore an object of the present invention to alleviate this disadvantage and to provide an illumination system comprising a radiation source and a monolithic ceramic luminescence converter with improved characteristics.

SUMMARY OF THE INVENTION

Thus the present invention provides an illumination system comprising a radiation source and a monolithic ceramic luminescence converter comprising a composite material comprising at least one luminescent compound and at least one non-luminescent compound, wherein the luminescent compound and the non-luminescent compound each comprise silicon and nitrogen.

According to a preferred embodiment of the invention the radiation source is a light emitting diode.

The term "monolithic ceramic luminescence converter" defines a ceramic body, which emits radiation in the visible or near infrared spectrum when stimulated electromagnetic radiation of higher energy. As such, the composite monolithic ceramic luminescence converter greatly simplifies the manufacturing of various geometries of phosphor-converted light emitting diodes.

A monolithic ceramic luminescence converter according to the invention comprises a composite of a luminescent compound and a non-luminescent compound, which share the common constitutional element of containing the ions of silicon and nitrogen. Such compounds are named either "silicon nitrides" or "nitridosilicates", in dependence of substitution by further main group elements or by metals.

A group of chemical compounds, which share constitutional elements, is called a "compound class". Compound classes either share the same functional groups, if the are of the organic-compound type, or they share the same ions, if they are of the inorganic-compound type. As members of a compound class share constitutional elements, they share also chemical and structural characteristics.

Shared chemical and structural characteristics facilitate manufacturing of a composite monolithic ceramic luminescence converter comprising a luminescent compound and a non-luminescent compound.

Shared chemical and structural characteristics also reduce the risk of destructive chemical reactions between luminescent and non-luminescent material, during manufacturing as well as under operation.

In addition, shared chemical and structural characteristics reduce the risk of mechanical failures in manufacturing and operation due to non-matching thermal expansion coefficients of the constituents, which may lead to built-up of mechanical stress in the monolithic ceramic luminescence converters.

Due to no or little difference in the indices of refraction in the two phases, less light will be refracted at the grain boundaries, i.e. be diffused. Thus taking a non-luminescent compound of the same compound class as the optical matrix for the luminescent particles leads to an additional advantage in tuning the color homogeneity of the pc-LED without introducing unwanted backscattering.

The compounds may additionally comprise one or more ions selected from the group of oxygen, boron, aluminum, gallium, germanium, phosphorus and carbon.

The compounds may additionally comprise a metal ion selected from the group of alkaline metals Na, K, Rb;

alkaline earth metals Be, Mg, Ca, Sr, Ba or group IIIB metals selected from the group Sc, Y, and La.

It goes without saying that the luminescent compound additionally comprises an activator, typically selected from the rare earth elements La, Ce, Pr, Nd, Pm, Sm, Eu, Gd, Tb, Dy, Ho, Er, Tm, Yb, and Lu. Especially useful with regard to the present invention are cerium, praseodymium, samarium, europium, terbium, ytterbium and manganese Sinter-additives may also be present in the composite composition. These additives particularly include such species known to the art as fluxes. Suitable fluxes include alkaline earth- or alkaline-metal oxides, borates, phosphates, silicates and halides such as fluorides, ammonium chloride, silica, SiONes, SiAlONes and mixtures thereof. The fluxes may be present in the monolithic ceramic composite converter within the luminescent or non-luminescent compounds as impurity ions or as additional phases within the grain boundary network. The flux phases may be vitreous or crystalline.

The non-luminescent compound may additionally comprise a modifier, selected from the group of transition metals Zr, Hf, Nb, Ta, W, Mo, Cr, Fe, Co, Ni, Zn, Sc, Y, La, main group elements Pb, Bi and f-elements Ce, Cr, Nd, Sm, Eu, Gd, Tb, Dy, Ho, Er, Tm, Yb, Lu, Th, and U. In some embodiments, such modifiers are useful to reduce the sintering temperature of the sinter-active non-luminescent compound.

An especially preferred embodiment of the invention is a composite monolithic ceramic luminescence converter, wherein the compound class of the luminescent compound and the non-luminescent compound is selected from the class of nitridosilicates, oxonitridosilicates, nitridoaluminosilicates and oxonitridoaluminosilicates.

Luminescent compounds of the class of nitridosilicates, oxonitridosilicates, nitridoaluminosilicates and oxonitridoaluminosilicates, particularly wherein the activator is selected from the group rare earth metals cerium, praseodymium, samarium, europium, terbium and ytterbium are chemically stable and efficient luminescent compounds, able to convert the blue light of a blue-emitting LED into green to red colors. They excel by their thermally stable emission properties. White LEDs made with a combination of red and green emitting luminescent compounds provide outstanding color rendering and spectral coverage. They are fully stable over the accessible temperature and radiation range of LEDs emitting in the UV- to blue range of the electromagnetic spectrum.

A combination of an amber to red emitting europium(II)-doped alkaline earth oxonitridoaluminosilicate of general formula $Ba_{2-x-z}M_xSi_{5-y}Al_yN_{8-y}O_y:Eu_z$, wherein M=Sr, Ca; $0 \le x \le 2$, $0 \le y \le 4$, $0.0005 \le z \le 0.06$) and a non-luminescent alkaline earth oxonitridoaluminosilicate compound of general formula $Ba_{1-x}M_xSi_{7-y}Al_yN_{10-y}O_y$, wherein M=Sr, Ca, Eu; $0 \le x \le 1$ and $0 \le y \le 3$ is an especially preferred embodiment of the invention. Such composites offer higher photothermal stability and a lower refractive index compared to single-phase $Ba_{2-x-z}M_xSi_{5-y}Al_yN_{8-y}O_y:Eu_z$ luminescent compounds and thus better light outcoupling into surrounding medium. In combination with a UVA- or blue emitting LED, this embodiment of the invention is especially useful for amber or red signaling lighting.

According to one variant of the invention the composite material is a particle-particle composite. The composite monolithic ceramic luminescence converter comprising a particle-particle composite can be formed as a compact unitary element with a homogeneous spatial distribution of luminescent compound grains in the non-luminescent compound.

Alternatively, in some embodiments of the invention a non-homogeneous spatial distribution of the luminescent compound may be preferred.

According to a second variant of the invention the composite luminescent material is a particle-matrix composite, wherein luminescent particles are dispersed in a continuous non-luminescent phase.

According to another variant of the invention, the composite is a stacked multilayer composite. The composite includes at least one first and one second component layers, which may be repeated. In cases where joint ceramic processing of different luminescent compounds is not possible, a laminated multilayer composite is a useful alternative to a particle-particle composite.

The invention is also concerned with a composite ceramic luminescence converter comprising a composite material comprising at least one luminescent compound and at least one non-luminescent compound, wherein the luminescent compound and the non-luminescent compound each comprise silicon and nitrogen.

According to a preferred embodiment, the monolithic ceramic luminescence converter has a density $\ge 97\%$ of the theoretical density, preferably $\ge 99\%$ of the theoretical density.

These and other objects, features and advantages will be apparent from the following detailed description, brief description of the drawings and appended claims and drawings.

DETAILED DESCRIPTION OF THE INVENTION

The present invention focuses on a monolithic ceramic luminescence converter (CLC) comprising a composite material comprising a single or a plurality of luminescent compounds, and a non-luminescent compound in any configuration of an illumination system comprising a source of primary radiation. As used herein, the term "radiation" encompasses radiation in the UV, IR and visible regions of the electromagnetic spectrum.

A composite monolithic ceramic luminescence converter is a ceramic member that is characterized by its typical microstructure. The microstructure of a monolithic ceramic luminescence converter is polycrystalline, i.e. an irregular conglomerate of crypto-crystalline or nanocrystalline crystallites. Crystallites are grown to come in close contact and to share grain boundaries. Macroscopically the monolithic ceramic seems to be isotropic, though the polycrystalline microstructure may be easily detected by SEM (scanning electron microscopy).

Due to their polycrystalline microstructure ceramic luminescence converters are transparent or have at least high optical translucency with low light absorption.

The microstructure of the monolithic ceramic luminescence converter according to the invention includes at least two distinct separated phases.

The first phase comprises at least one luminescent compound comprising an activator in a host lattice, wherein the host lattice comprises silicon and nitrogen.

The second phase in the composite material comprises a non-luminescent compound of the same compound class that acts as a ceramic binding agent and as an optical matrix.

Because nitrogen, comprised therein, is less electronegative than oxygen, nitrides, containing the $N^{3-}$ ion, exhibit a range of structures and properties somewhat different from those of the more familiar oxidic materials.

Nitrides, oxonitrides and nitridosilicates may crystallize in a structure-type containing a two- or three-dimensional network of cross-linked $SiN_4$-tetrahedra or $Si(N,O)_4$-tetrahedra, in which alkaline earth ions (M=Ca, Sr and Ba) may be incorporated.

Besides the simple nitridosilicates and oxonitridosilicates complex nitridosilicates comprising further main-group elements, e.g. phosphorus, carbon, germanium, boron, gallium, or aluminum, may be used.

For charge balance the simple or complex nitridosilicates and oxonitridosilicates may comprise a metal ion selected from the group of alkaline metals Na, K, Rb; alkaline earth metals Be, Mg, Ca, Sr. Ba or group IIIB metals selected from the group Sc, Y, La.

According to a preferred embodiment of the invention the shared compound class of the luminescent and the non-luminescent compound is the class of nitridosilicates, oxonitridosilicates (sions), nitridoaluminosilicates and oxonitridoaluminosilicates (sialons), alone or in combination with alkali, alkaline earth, group IIIB and rare earth elements.

A number of useful luminescent compounds belonging to this compound class are known in the prior art. The luminescent compounds typically have excitation wavelengths in the blue to near UV range of the electromagnetic spectrum (300-475 nm) and emission wavelengths in the visible wavelength range. A composite of a plurality of luminescent compounds may be formulated to achieve the desired color balance, as perceived by the viewer, for example a mixture of amber to red- and yellow to green-emitting luminescent compounds.

Besides of the luminescent compounds of the special embodiments described below, typical luminescent compounds suitable for use in the ceramic composite comprise a material selected from the amber to red emitting (590-630 nm) luminescent compounds of general formula $EA_2Si_5N_8$:Eu, wherein EA is at least one alkaline earth metal chosen from the group of calcium, barium and strontium.

Other luminescent compounds that satisfy the conditions of the invention are oxonitridoaluminosilicates of general formula $(Sr_{1-x}EA_x)_{2-z}Si_{5-a}(Al_{1-b}B_b)_aN_{8-a}O_a$:$Ln_z$, wherein $0<a<5$, $0<b\le 1$, $0<x\le 1$ and $0<z\le 1$, comprising at least one element EA selected from the group consisting of Mg, Ca, Ba and Zn and at least one element B selected from the group consisting of boron, aluminum, gallium, indium and scandium and being activated with a lanthanide selected from the group consisting of cerium, europium, terbium, praseodymium, samarium or manganese and mixtures thereof.

Particular useful luminescent compounds are red emitting europium(II)-activated oxonitridoaluminosilicates of general formula $EA_{2-z}Si_{5-a}Al_aN_{8-a}O_a$:$Eu_z$ wherein $0<a\le 2$ and $0<z\le 0.2$; EA is at least one earth alkaline metal chosen from the group of calcium, barium and strontium.

Further useful red-emitting luminescent compounds are ytterbium(II)-activated oxonitridosilicates of general formula $(Sr_{1-x-y-z}Ca_xBa_y)_aSi_bAl_cN_dO_e$:$Yb_z$, wherein $0\le x\le 1$; $0\le y\le 1$; $0.001\le z\le 0.02$; $0<a\le 2$; $0<b\le 2$; $0<c\le 2$; $0<d\le 7$; $0<e\le 2$; cerium-activated carbido-nitridosilicate of general formula $(Ln_{1-z})_{2-a}Ca_aSi_4N_{6+a}C_{1-a}$:$Ce_z$ wherein $0\le a<1$, $0<z\le 0.1$ and Ln is a least one rare earth metal chosen from the group of yttrium, gadolinium and lutetium; (Ca,Sr)$AlSiN_3$:Eu, rare earth metal-activated nitridoaluminosilicates of general formula $(Ca_{1-x-y-z}Sr_xBa_yMg_z)_{1-n}(Al_{1-a-b}B_a)SiN_2N_{1-b}O_b$: $RE_n$, wherein $0<x\le 1$, $0\le y<1$, $0\le z<1$, $0\le a<1$, $0\le b\le 1$ and $0.0002<n\le 0.2$ and RE is selected from europium(II) and cerium(III), and other nitridosilicate luminescent materials having emission spectra in the red region of the visible spectrum upon excitation as described herein.

These luminescent nitridosilicate compounds emit in the amber to red spectral range of the visible spectrum and thus can provide the amber to red component in LEDs emitting specific colors or white light. Additional important characteristics of the luminescent compounds include resistance to thermal quenching of luminescence at typical device operating temperatures (e.g. 80° C.); suitable absorption profiles to minimize dead absorption within the visible spectrum; a stable luminous output over the operating lifetime of the device and; compositionally controllable tuning of the luminescent compounds excitation and emission properties.

In another preferred embodiment of the invention green light is produced by means of the luminescent components of the composite monolithic ceramic luminescence converter, that comprises a green-emitting (480-560 nm) luminescent compound of general formula $EASi_2N_2O_2$:Eu, wherein EA is at least one alkaline earth metal chosen from the group of calcium, barium and strontium.

For green emission, typical luminescent compounds that are also suitable for use in the present invention are compounds that have the general formula $(Sr_{1-a-b}Ca_bBa_c$-$Mg_dZn_e)Si_xN_yO_z$:$Eu_a$, wherein $0.002\le a\le 0.2$, $0.0\le b\le 0.25$, $0.0\le c\le 0.25$, $0.0\le d\le 0.25$, $0.0\le e\le 0.25$, $1.5\le x\le 2.5$, $1.5\le y\le 2.5$ and $1.5<z<2.5$.

For blue to green emission typical luminescent compounds that are useful for the present invention are compounds that have the general formula $(Ba_{1-x-a}M_x)Si_{7-y}Al_yN_{10-y}O_y$:$Eu_a$, wherein M=Sr, Ca, $0.002\le a\le 0.2$, $0\le x\le 1$, and $0\le y\le 3$, $Ba_{1-z-a}M_zSi_{6-x}Al_xN_{8-x}O_{y+x}$:$Eu_a$ wherein M=Sr, Ca, $0.002\le a\le 0.2$, $0\le x\le 4$, $0\le y\le 1$ and $0\le z\le 1$.

In certain embodiments, additionally further luminescent compounds may be included in the composite material.

The second phase in the composite ceramic luminescence converter comprises a non-luminescent material of the same compound class that acts as a ceramic binding agent and as an optical matrix.

Preferred are nitridosilicates, oxonitridosilicates (sions), and oxonitridoaluminosilicates (sialons), alone or in combination with alkaline, alkaline earth and rare earth elements.

Said materials have excellent optical transparency at wavelength at which excitation and luminescence of the activator ion of the luminescent material occurs.

Examples of preferred compounds include nitridosilicates $Ba_{1-x}M_xSi_{7-y}Al_yN_{10-y}O_y$, wherein M is selected from strontium and calcium, $LnSi_3N_5$, wherein Ln is selected from La, Ce, Pr, Nd, $Ba_{1-z}M_zSi_{6-x}Al_xN_{8-x}O_{y+x}$, wherein M is selected from strontium and calcium and $0\le y\le 1$, and $MYSi_4N_7$, wherein M is selected from Sr, Ba, respectively.

It is a preferred condition of the selection of the non-luminescent compound, that the non-luminescent compound comprising silicon and nitrogen is sinter-active at low temperatures. Sinterability may be improved, if the silicon nitride non-luminescent compound comprises also some aluminum and or oxygen. Useful are compounds of general formula $Si_{6-x}Al_xO_xN_{8-x}$, wherein $0\le x\le 0.42$. Especially preferred are non-luminescent compounds sharing also metals ions with the luminescent compound of general formula $M_{m/v}Si_{12-(m+n)}Al_{m+n}O_nN_{16-n}$, wherein M relates to one or more metal ions and, v refers to the oxidation state of metallic ion and m and n can be varied in a wide range. Preferably the metal ions are selected from the group of alkali metals Na, K, Rb and alkaline earth metals Be, Mg, Ca, Sr. Ba.

Particularly aluminum acts as a sintering accelerator for the silicon nitride and improves sinter density. However, when aluminum oxide is used alone, the mechanical properties of the composite, such as mechanical strength and fracture toughness are decreasing.

The non-luminescent compound may additionally comprise an ion of a modifier, selected from the group of transition metals Zr, Hf, Nb, Ta, W, Mo, Cr, Fe, Co, Ni, Zn, Sc, Y, La, main group elements Pb, Bi and f elements Ce, Cr, Nd, Sm, Eu, Gd, Tb, Dy, Ho, Er, Tm, Yb, Lu, Th, Pa and U. The modifier helps to lower the sintering temperature and to improve the densification behaviour of the ceramic.

Additional phases that improve sinterability from the group of nitridosilicates, oxonitridosilicates, nitridoaluminosilicates and oxonitridoaluminosilicates may be found after sintering as glassy (vitreous) or crystalline phases, when combined with network modifiers, e.g. barium, strontium, calcium, or magnesium.

The above-described non-luminescent compounds do not form a solid solution with the luminescent particles, the luminescent particles stay as independent dispersed particles phase separate from the non-luminescent phase, forming an evenly dispersed phase.

Especially preferred is an embodiment of the composite ceramic luminescence converter wherein an amber to red-emitting luminescent compound of general formula $Ba_{2-x-z}M_xSi_{5-y}Al_yN_{8-y}O_y:Eu_z$, wherein M=Sr, Ca; $0 \leq x \leq 1$, $0 \leq y \leq 4$, $0.0005 \leq z \leq 0.06$ is combined with a non-luminescent SiAlON-phase of general formula $Ba_{1-x}M_xSi_{7-y}Al_yN_{10-y}O_y$, wherein M=Sr, Ca; $0 \leq x \leq 1$ and $0 \leq y \leq 3$.

Ceramic composite color converters that are composed of densely sintered $Ba_{2-x-z}M_xSi_{5-y}Al_yN_{8-y}O_y:Eu_z$ (M=Sr, Ca) grains and $MSi_7N_{10}$ (M=Ba, Sr, Eu) grains, also comprising some europium, are remarkably stable against photothermal oxidation of the activator Eu(II) to Eu(III). This may be caused by the reduction of cation vacancies formed in the $Ba_{2-x-z}M_xSi_{5-y}Al_yN_{8-y}O_y:Eu_z$ (M=Sr, Ca) grains during sintering. Cation vacancies may be formed, because losses of barium occur at high sintering temperatures and are charge-compensated by the creation of oxygen defects on N sites (Eq. 1).

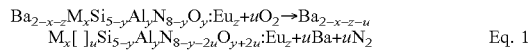

$$Ba_{2-x-z}M_xSi_{5-y}Al_yN_{8-y}O_y:Eu_z + uO_2 \rightarrow Ba_{2-x-z-u}M_x[\ ]_uSi_{5-y}Al_yN_{8-y-2u}O_{y+2u}:Eu_z + uBa + uN_2 \quad \text{Eq. 1}$$

These defects may act as trapping centers that promote photodegradation of the Eu(II).

In the composite converter ceramics according to the special embodiment, M loss in the $Ba_{2-x-z}M_xSi_{5-y}Al_yN_{8-y}O_y:Eu_z$ (M=Sr, Ca) grains is compensated by formation of more $MSi_7N_{10}$ (M=Ba, Sr) phase at the grain boundaries between $Ba_{2-x-z}M_xSi_{5-y}Al_yN_{8-y}O_y:Eu_z$ (M=Sr, Ca) and $MSi_7N_{10}$ (M=Ba, Sr) ceramic grains. This leads to a reduction of lattice defects in the $Ba_{2-x-z}M_xSi_{5-y}Al_yN_{8-y}O_y:Eu_z$ (M=Sr, Ca) grains and thus to a greatly enhanced photothermal stability. Vice versa during sintering also some diffusion of the activator Eu(II) through the phase interface into the non-luminescent $MSi_7N_{10}$ ceramic grains may occur.

Advantages of the ceramic composite luminescence converters of the specific embodiment over known amber to red emitting powder nitride luminescent compounds: are (a) higher quantum efficiency due to improved grain morphology in the composite matrix, (b) enhanced conversion efficiency because of reduced scattering of the luminescence converter, (c) higher photothermal stability, (d) lower refractive index of the composite material and thus better light outcoupling into surrounding medium with lower refractive index.

As evident, the relative quantities of the luminescent and the non-luminescent compounds can be chosen to affect the final properties of the composite and may vary widely, depending on the desired application.

For partial conversion of the primary light emitted from the LED the amount of luminescent compound particles and their size are advantageously chosen such that the path length through the ceramic luminescence converter is so long that enough primary light from a light-emitting LED is converted into secondary visible light and so short that an adequate amount of primary light is passed through the embedded phosphor layer. For full conversion primary light should not pass through the ceramic luminescence converter and its thickness is chosen to perform at optimum efficiency with reduced leakage light.

The resultant light does not only scatter light in the forward direction but also backwards. The backscattered light has a considerable chance of being reabsorbed in the LED. This decreases the efficiency. It was found that with a volume of the luminescent material of at most 80 vol. % backscatter losses can be kept to a reduced level well below the 20 to 30% range.

A further improvement is achieved by controlling the porosity and the pore size distribution. In an advantageous embodiment, the ceramic composite has a porosity of at most 3%, corresponding to a density of <97% of the theoretical density. According to a preferred embodiment of the invention the density is close to 100% of the theoretical density.

Furthermore, the pore sizes should be kept small, for example smaller than 3000 nm, preferably smaller than about 2000 nm. Best results are achievable with a pore sizes below 1000 nm.

With regard to the preparation of composite ceramic luminescence converters it is a particularly important aspect, that the luminescent compound is combined with the non-luminescent compound and consolidated to form the composite material in a manner that ensures that the microstructure of the solid monolithic composite is characterized by luminescent grains which maintain or improve their respective luminescent properties.

To achieve this aspect, the individual constituent materials may essentially not react with one another in order to preserve their distinct crystalline phases because any interaction would significantly diminish the desired luminescent properties. According to a preferred embodiment, the luminescent compound and the non-luminescent compound are neighbors in the respective phase diagram and form a eutectic.

In embodiments, some useful interaction between luminescent and non-luminescent compound has been observed. For example, a luminescent nitridosilicate compound may react with an oxidic alkaline earth precursor to form an oxosilicate glassy or crystalline phase at grain boundaries which leads to a reduction of oxygen content in the luminescent nitridosilicate grains and thus to an improvement of their respective luminescent properties.

Also distinct crystalline phases may also be formed in situ during the consolidation of the composite material. For example, a luminescent $AE_2Si_5N_8:Eu$ phase may react to some extend with an alkaline earth orthosilicate phase added as sintering flux to form a small amount of glass phase and non-luminescent $AESi_7N_{10}$ phase. Unwanted glass phases may be removed from the ceramic composite luminescence converter by a suitable post-processing method such as hot isostatic pressing to improve the optical properties.

The method of manufacturing differs slightly with the preferred microstructure of the luminescence converter. The microstructure of a monolithic ceramic luminescence converter may be a polycrystalline particle-particle composite, a particle-matrix composite or a laminated composite.

In a preferred method of manufacturing a composite monolithic ceramic luminescence converter comprising a luminescent and a non-luminescent compound in a composite arrangement the components of the composite material are provided in a particle-particle-composite arrangement.

Ceramic particle-particle composites are polycrystalline, i.e. they comprise an irregular conglomerate of cryptocrystalline, microcrystalline or nanocrystalline crystallites. During manufacturing, crystallites are grown to come into close contact and share grain boundaries. Macroscopically the monolithic ceramic seems to be isotropic; however, the polycrystalline microstructure can be easily detected by SEM (scanning electron microscopy).

Due to their almost pore-free monolithic polycrystalline microstructure, luminescent monolithic ceramic luminescence converters are transparent or have at least high optical translucency with low light absorption.

Such a particle-particle composite was prepared according to a method that entailed preparing (i) a powder mixture of a luminescent compound with a second material that is selected from the group of precursors of the non-luminescent compound, ((ii) powder compacting and shaping the mixture into a preform, and (iii) co-sintering the preformed mixture, eventually followed by further annealing In one embodiment of the method, the precursor of the non-luminescent compound is provided as a "green" ceramic material. "Green" in this context refers to a fired, reactive, but not yet sintered ceramic material.

A "green" ceramic material has a density less than theoretical density, typically less than 65% of theoretical density. It also has typically a fine grain size in the range from 100 nm to 5 μm.

"Green" precursor material of non-luminescent compound is combined with a luminescent compound of a pre-sintered coarse grain size (particle size of about 1.0 to 10 micron). The non-luminescent compound is preferably the one with the lower sintering temperature in comparison to the luminescent compound. Separate sintering temperatures of the luminescent compounds help to preserve the phase constituent separation and thus reduce the likelihood of an unwanted interaction between the constituents.

The two materials may be mixed using standard ball milling techniques, though other methods known in the art could also be used with suitable results.

Once sufficiently mixed, the mixture is shaped into a preform. The solid composite preform should exhibit sufficient strength and toughness to resist chipping and cracking, as well as permit preshaping.

The preform is then sintered under the sintering conditions with regard to temperature and atmosphere that apply for sintering of the non-luminescent compound. Sintering treatment is provided for a desired amount of time to densify the ceramic to substantially its theoretical density to form a highly translucent material. These parameters assure a minimum porosity and maximum density without interaction of the constituent materials.

Especially preferred is a hot uniaxial pressure treatment, or otherwise a cold isostatic pressure treatment followed by sintering. A combination of cold isostatic pressing and sintering followed by hot isostatic pressing may also be applied.

Careful supervision of the densification process is necessary to control grain growth and to remove residual pores.

Shaping and sintering treatment of the luminescent material results in a composite monolithic ceramic member, which is easily sawed and machined by known ceramic procedures. Preferably, the composite monolithic ceramic luminescence converter is polished to get a smooth surface and to impede diffuse scattering caused by surface roughness.

Preferably the surface roughness RMS (disruption of the planarity of a surface; measured as the geometric mean of the difference between highest and deepest surface features) of the surface(s) of the ceramic composite converter is ≥0.001 μm and ≤0.5 μm.

Most preferred is an embodiment of the present invention, wherein the surface roughness is ≥0.03 μm and ≤0.15 μm.

According to a preferred embodiment of the present invention, the specific surface area of the at least one ceramic composite material is $\geq 10^{-7}$ m$^2$/g and ≤0.1 m$^2$/g.

Typically, the luminescent as well as the non-luminescent compound consist of more than 80 percent of single crystal domains, with each domain being larger than 0.5 μm in diameter and having different crystallographic orientations. The single crystal domains may be connected by additional amorphous or glassy material or by additional crystalline constituents.

According to a preferred embodiment, the at least one composite ceramic material has a density of ≥97% and ≤100% of the theoretical density of the composite which is the density of a 100% pore free material. This has been shown to be advantageous for a wide range of applications within the present invention since then the luminescence and optical properties of the at least one ceramic composite material may be increased.

More preferably the at least one ceramic composite material has a density of ≥99%.

Using the above processing method, the luminescent compounds are able to retain or improve their luminescent properties because both, efficiency of luminescence conversion and photothermal stability are enhanced. This result is highly unexpected, in that some reduction in the respective properties would be expected when co-sintering materials to form a composite. However, no loss in luminescent properties occurs.

According to another embodiment of the invention the microstructure of the composite is a particle-matrix composite, wherein the crystalline particles of the luminescent compound are dispersed in a continuous matrix of an amorphous or vitreous non-luminescent compound.

Dispersion in both vitreous and amorphous matrices can be prepared by sol-gel processes as well as by conventional powder and melt techniques, and by solid and vitreous sintering processes, in which the luminescent particles are processed within the matrix materials.

The method of manufacturing is useful in embodiments, wherein the non-luminescent compound is a SiAlON-glass. Such glasses are known in the prior art as well as liquid phase sintering thereof.

Apart from forming said particle-particle composite or particle-matrix composite, the phases of the luminescence converter may also be assembled a laminated composite in a multilayer arrangement.

In the laminated composite, the first layer comprises luminescent compound particles of a first luminescent compound plus non-luminescent compound and the second layer comprises particles of a second luminescent compound plus non-luminescent compound.

Tape casting using the doctor blade technique is widely used on the production of ceramic laminated multilayer composites, starting with green sheets that are subsequently co-fired and diced to form multilayered composite ceramic luminescence converters.

In certain embodiments of the invention, it may be useful to post-shape the sintered composite monolithic CLC, which can be done using routine procedures well known for ceramic materials. E.g. roughening the top surface of the composite monolithic CLC may be useful to scatter the converted light to improve light outcoupling, particularly, e.g., when the CLC has a high index of refraction.

According to a second aspect of the invention an illumination system comprising a radiation source and a monolithic ceramic luminescence converter comprising a composite material comprising at least one luminescent compound and at least one non-luminescent compound, wherein the luminescent compound and the non-luminescent compound each comprise silicon and nitrogen is provided.

Radiation sources include preferably semiconductor optical radiation emitters and other devices that emit optical radiation in response to electrical excitation. Semiconductor optical radiation emitters include light emitting diode LED chips, light emitting polymers (LEPs), laser diodes (LDs), organic light emitting devices (OLEDs), polymer light emitting devices (PLEDs), etc. Moreover, radiation-emitting sources such as those found in discharge lamps and fluorescent lamps, such as mercury low and high-pressure discharge lamps, sulfur discharge lamps, and discharge lamps based on molecular radiators as well as on X-ray tubes are contemplated for use as radiation sources with the present inventive luminescence converter.

In a preferred embodiment of the invention the radiation source is a light-emitting diode.

Any configuration of an illumination system, which includes a light-emitting diode, or an array of light-emitting diodes and a composite monolithic ceramic luminescence converter comprising a plurality of luminescent compounds is contemplated in the present invention, to achieve a specific colored or white light when irradiated by a LED emitting primary UV or blue light as specified above.

Possible configurations useful to couple the composite monolithic ceramic luminescence converter to a light emitting diode or an array of light emitting diodes comprise epitaxy-up devices as well as flip chip devices.

A detailed construction of one embodiment of such an illumination system comprising a radiation source and a composite monolithic ceramic luminescence converter will now be described.

FIG. 1 schematically illustrates a specific structure of a solid-state illumination system 1 comprising a composite monolithic ceramic luminescence converter 2, wherein the LED die 4 is packaged in a flip chip configuration on a substrate 6, with both electrodes 5 contacting the respective leads without using bond wires. The LED die is flipped upside down and bonded onto a thermally conducting substrate. The monolithic ceramic luminescence converter is configured as a plate, which is positioned in such a way that most of the light, which is emitted from the light-emitting diode, enters the plate at an angle which is approximately perpendicular to the surface of the plate. To achieve this, a reflector 3 is provided around the light-emitting diode in order to reflect light that is emitted from the light-emitting diode in directions toward the disk.

Although FIG. 1 illustrates a particular LED structure, the present invention is independent of any particular structure of the LED die. For example, the number of substrates and semiconductor layers in LED die and the detailed structure of active region may be varied. Additionally, LED die is illustrated in FIG. 1 as having a "flip-chip" type architecture, i.e., the electrodes 5 are located on the same side of the LED die 1. If desired, however, other types of LED die architecture may be used with the present invention, such as having the electrodes 5 on opposite sides of the die.

The composite monolithic ceramic luminescence converter may be fixed to the LED die 2, e.g., by placing a transparent bonding layer 7 of a high temperature optically transparent resin material, such as epoxy, silicone or the like, between the luminescence converter and the LED die. When cured, the bonding layer 7 holds the luminescence converter to the LED die.

Otherwise, low softening point glass is useful when bonding the composite monolithic ceramic luminescence converter directly to the LED die. The materials may be bonded, by elevating the temperature of the LED die and the composite monolithic CLC above the softening point of the glass, and applying a pressure to press the materials together.

In operation, electrical power is supplied to the die to activate the die. When activated, the die emits the primary light, e.g. blue light. A portion of the emitted primary light is partially or completely absorbed by the ceramic luminescence converter. The ceramic luminescence converter then emits secondary light, i.e., the converted light having a longer peak wavelength, in response to absorption of the primary light. Remaining unabsorbed portion of the emitted primary light is transmitted through the ceramic luminescence converter, along with the secondary light, if applicable.

The reflector directs the unabsorbed primary light and the secondary light in a general direction as output light. Thus, the output light is a composite light that is composed of the primary light emitted from the die and the secondary light emitted from the fluorescent layer.

The color temperature or color point of the output light of an illumination system according to the invention will vary depending upon the spectral distributions and intensities of the secondary light in comparison to the primary light.

Firstly, the color temperature or color point of the primary light can be varied by a suitable choice of the light emitting diode.

Secondly, the color temperature or color point of the secondary light can be varied by a suitable choice of the compositions of the luminescent compound in the composite monolithic ceramic luminescence converter.

Also the thickness and the relative luminescent contents in the composite may be configured to convert a desired percentage of primary light that is incident on the composite monolithic CLC.

Depending on the light-emission wavelength of the light emitting diode and the luminescent compound light emission of an arbitrary point in the chromaticity diagram in the color polygon formed by the color points of the single or the plurality of luminescent compounds and of the light emitting element can be provided.

According to one aspect of the invention an illumination system that emits output light having a spectral distribution such that it appears to be colored, e.g. "amber", "red" or "green", is provided.

According to alternative embodiment of the invention the output light of the illumination system may have a spectral distribution such that it appears to be "white" light.

The term "white light" refers to light that stimulates the red, green, and blue sensors in the human eye to yield an appearance that an ordinary observer would consider "white".

Specific Embodiment

In a preferred embodiment of the invention amber or red light is produced by means of the luminescent compound of the composite monolithic ceramic luminescence converter, wherein an amber or red-emitting luminescent compound of general formula $Ba_{2-x-z}M_xSi_{5-y}Al_yN_{8-y}O_y:Eu_z$, wherein M=Sr, Ca; $0 \leq x \leq 1$, $0 \leq y \leq 4$, $0.0005 \leq z \leq 0.06$ is combined with a non-luminescent SiAlON-phase of general formula $Ba_{1-x}M_xSi_{7-y}Al_yN_{10-y}O_y$, wherein M=Sr, Ca; $0 \leq x \leq 1$ and $0 \leq y \leq 3$. Embodiments wherein z<0.06 and M consists of less than 50% of Sr and/or Ca are especially preferred.

For amber emission, the luminescent compound of general formula $Ba_{2-x-z}M_xSi_{5-y}Al_yN_{8-y}O_y:Eu_z$ preferably has a composition $0 \leq x \leq 0.7$, $0 \leq y \leq 1$, $0.001 \leq z \leq 0.01$.

For red emission, the luminescent compound of general formula $Ba_{2-x-z}M_xSi_{5-y}Al_yN_{8-y}O_y:Eu_z$ preferably has a composition wherein $0.4 \leq x \leq 2$, $0 \leq y \leq 2$, $0.001 \leq z \leq 0.03$.

The flow diagram depicted in FIG. 4 shows schematically, how specific composite ceramics comprising $(Ba,Sr)_{2-z}Si_{5-y}Al_yN_{8-y}O_y:Eu_z$, wherein $0 \leq y \leq 4$ and $0.0005 \leq z \leq 0.06$, and $BaSi_7N_{10}$ are prepared.

The preparation of a crystalline, pre-sintered powder material of amber or red-emitting $(Ba,Sr)_{2-z}Si_{5-y}Al_yN_{8-y}O_y:Eu_z$ starts with the preparation of the mixed oxides of the divalent metals (Sr,Ba)O:Eu.

To prepare the mixed oxides (Sr,Ba)O:Eu of the divalent metals, high purity nitrates, carbonates, oxalates and acetates of the alkaline earth metals and europium(III) were dissolved by stirring in deionized water. A desirable concentration of europium(III) with respect to the alkaline earth cations is between about 0.1 and 3 mole percent.

The solutions are stirred while being heated on a hotplate until the water has evaporated, resulting in a white or yellow paste, depending on the composition.

The solids are dried overnight (12 hours) at 120° C. The resulting solid is finely ground and placed into a high-purity alumina crucible. The crucibles are loaded into a tube furnace, after which they are purged with flowing nitrogen/hydrogen for several hours. The furnace parameters are 10° C./mm to 1000° C., followed by a 4-hour dwell at 1000° C., after which the furnace is turned off and allowed to cool to room temperature. To improve the powder morphology, carbon may be added to the powder mixture before firing.

The divalent metal oxides (Sr,Ba)O:Eu are then mixed with silicon nitride $Si_3N_4$, AlN and graphite in predetermined ratios. The mixture is placed into a high purity tungsten or SiC crucible. The crucibles are loaded into a tube furnace and purged with flowing nitrogen/hydrogen (forming gas) for several hours. The furnace parameters are 10° C./min to 1450° C., followed by a 4 hour dwell at 1450° C. after which the furnace is slowly cooled to room temperature. The samples are once again finely ground before a second annealing step at 1450° C. is performed. The sintered coarse grain ceramic powder of $(Ba,Sr)_2Si_{5-y}Al_yN_{8-y}O_y:Eu_z$ has an average grain size of 2 to 8 μm.

Generally sintering is performed in an inert or reducing atmosphere. A nitrogen-acetylene atmosphere, a nitrogen-hydrogen atmosphere and an ammonia atmosphere can be given as examples of the reducing atmosphere.

The preparation of the precursor material of the non-luminescent compound $BaSi_7N_{10}$ starts with preparation of a mixture of barium carbonate, silicon nitride and milled graphite in predetermined ratios.

The mixture is placed into a high-purity tungsten or SiC crucible. The crucibles are loaded into a tube furnace and purged with flowing nitrogen/hydrogen for several hours. The furnace parameters are 10° C./mm to 1500° C., followed by a 4-hour dwell at 1500° C., after which the furnace is slowly cooled to room temperature.

To prepare the composite monolithic CLC, the ultrafine submicron precursor material of the $BaSi_7N_{10}$ compound and the coarse-grained sintered luminescent compound are mixed. The mixture is hot uniaxially pressed at 40-80 Mpa for 2 to 12 hrs at 1500°-1650° C.

After cooling down to room temperature the composite monolithic ceramic disks obtained were sawed into wafers. These wafers were grinded, polished and diced to obtain the final translucent composite monolithic ceramic luminescence converter comprising a composite ceramic body of $(Ba,Sr)_{2-z}Si_{5-y}Al_yN_{8-y}O_y:Eu_z$, wherein $0 \leq y \leq 4$ and $0.0005 \leq z \leq 0.06$, and $Ba_{1-x}M_xSi_7N_{10}:Eu$ (M=Sr, Eu).

When the crystal phases thus obtained were evaluated by X-ray diffraction, the luminescent phase was identified as a crystalline phase of the orthorhombic $Ba_2Si_5N_8$-lattice type (PDF file number 01-085-0102) and the non-luminescent phase was identified as a crystalline phase of the $BaSi_7N_{10}$-lattice type (PDF file number 01-089-6751).

A schematic drawing of the microstructure of the CLC of this embodiment is given in FIG. 2.

In the SEM picture of a polished surface of the composite ceramic in FIG. 3 two types of grains are to be seen, specified by lighter and darker shades of grey, remaining porosity appears in form of black areas.

The average grain size of the $Ba_{2-x-z}M_xSi_{5-y}Al_yN_{8-y}O_y:Eu_z$ (M=Sr, Ca) particles is in the 2-40 μm range, the $MSi_7N_{10}$ matrix material content as volume fraction is in the 10-80% range and the remaining porosity of the sample after processing is <3%.

From the observation of the SEM, it was verified that the particles of the luminescent compound were present independently of the non-luminescent phase, sharing grain boundaries.

Energy dispersive X-ray fluorescence spectroscopy (EDX) reveals that the lighter areas are composed mainly of $M_2Si_5N_8$-phase, whereas the darker areas are mainly $MSi_7N_{10}$-phase.

The results of the EDX measurements are represented in Table 1.

TABLE 1

Results of EDX analyses of lighter and darker areas.

| | Si [at. %] | Ba [at. %] | Sr [at. %] | Eu [at. %] |
|---|---|---|---|---|
| Dark area | 81.72 | 15.81 | 2.14 | 0.33 |
| Light area | 66.23 | 19.14 | 12.62 | 2.01 |

The CLC microstructure of this special embodiment features a statistical granular structure of crystallites forming a grain boundary network. The ceramics exhibit a density of 97% of the theoretical density.

Such a color converting structure may be combined with an AlInGaN LED light source to provide an illumination system with high efficiency and improved chromatic consistency. Particularly good results are achieved with a blue LED whose emission maximum lies at 380 to 480 nm. An optimum has been found to lie at 415 to 450 nm, taking particular account of the excitation spectrum of the europium(II)-activated $Ba_{2-x-z}M_xSi_{5-y}Al_yN_{8-y}O_y:Eu_z$, (M=Sr, Ca). Traces of divalent europium, present in the $BaSi_7N_{10}$-phase are not excited by such radiation, but are transparent to it.

The illumination system comprising composite monolithic ceramic luminescence converter and the composite monolithic ceramic luminescence converter according to the present invention are of use in a broad variety of systems and/or applications, amongst them office lighting systems, household application systems, shop lighting systems, home lighting systems, accent lighting systems, spot lighting systems, theatre lighting systems, fiber-optics application systems, projection systems, self-lit display systems, pixelated display systems, segmented display systems, warning sign systems, medical lighting application systems, indicator sign systems, decorative lighting systems, portable systems, automotive applications and green house lighting systems.

Although the present invention is illustrated in connection with specific embodiments for instructional purposes, the present invention is not limited thereto. Various adaptations and modifications may be made without departing from the scope of the invention. For example, the composite luminescence converters may be manufactured from luminescent materials other than the luminescent compounds cited. Therefore, the spirit and scope of the appended claims should not be limited to the foregoing description.

Figure 1:
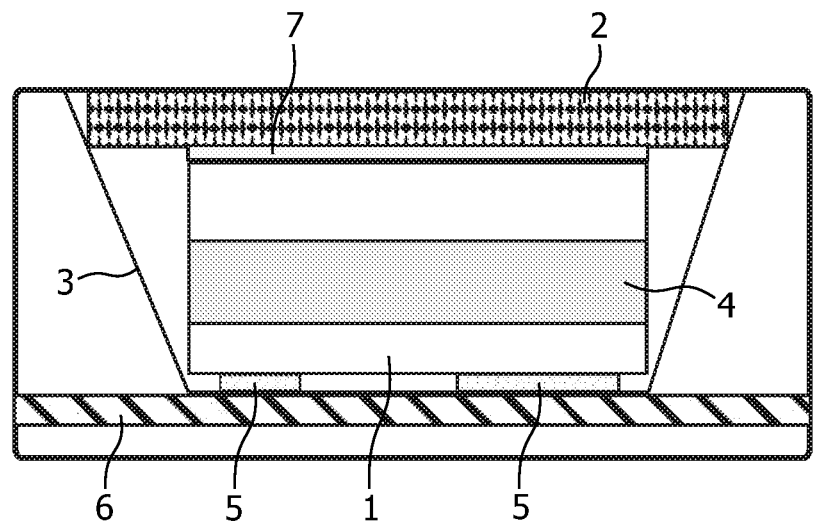
FIG. 1 shows a schematic side view of ac white LED lamp comprising a composite ceramic luminescence converter of the present invention positioned in the pathway of light emitted by an light-emitting diode flip chip structure.
Figure 2:
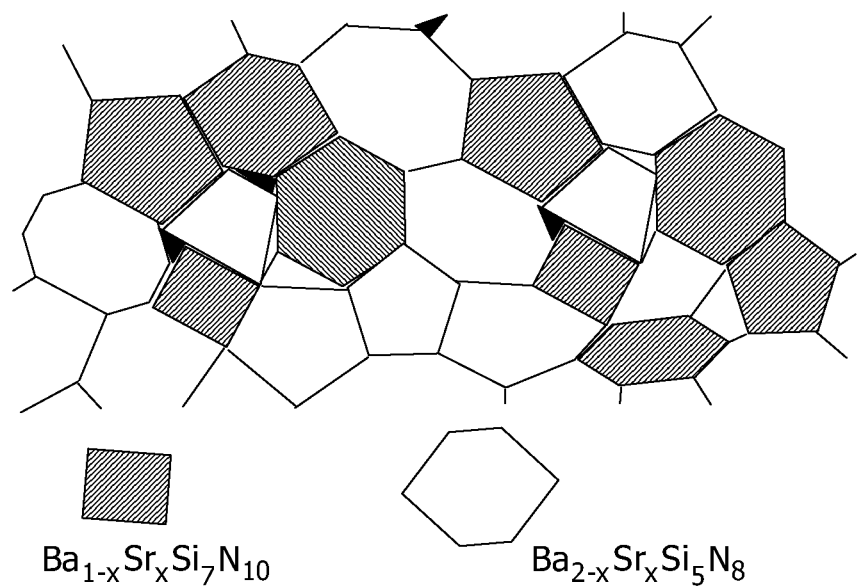
FIG. 2 illustrates in a schematic sketch the microstructure of a composite monolithic ceramic luminescence converter, according to the specific embodiment.
Figure 3:
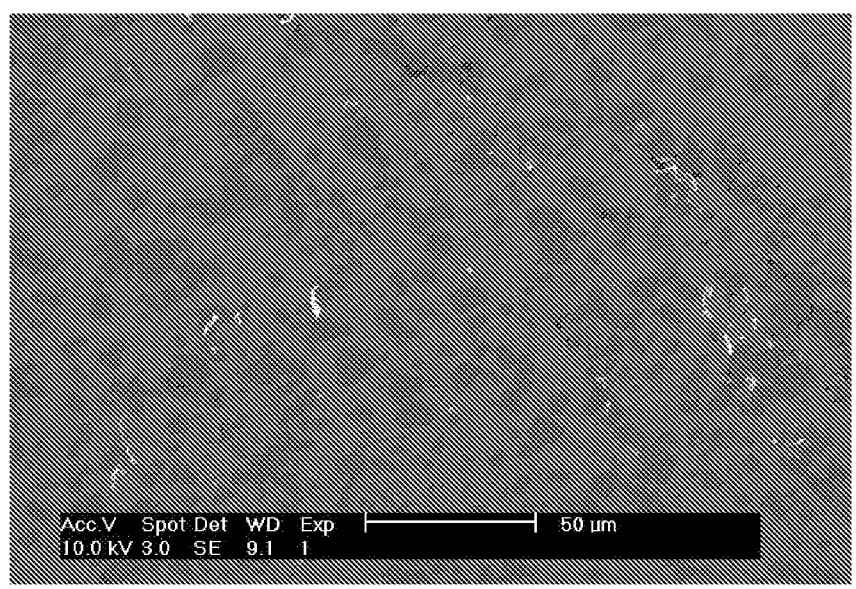
FIG. 3 shows the scanning electron micrograph of a composite ceramic luminescence converter.
Figure 4:
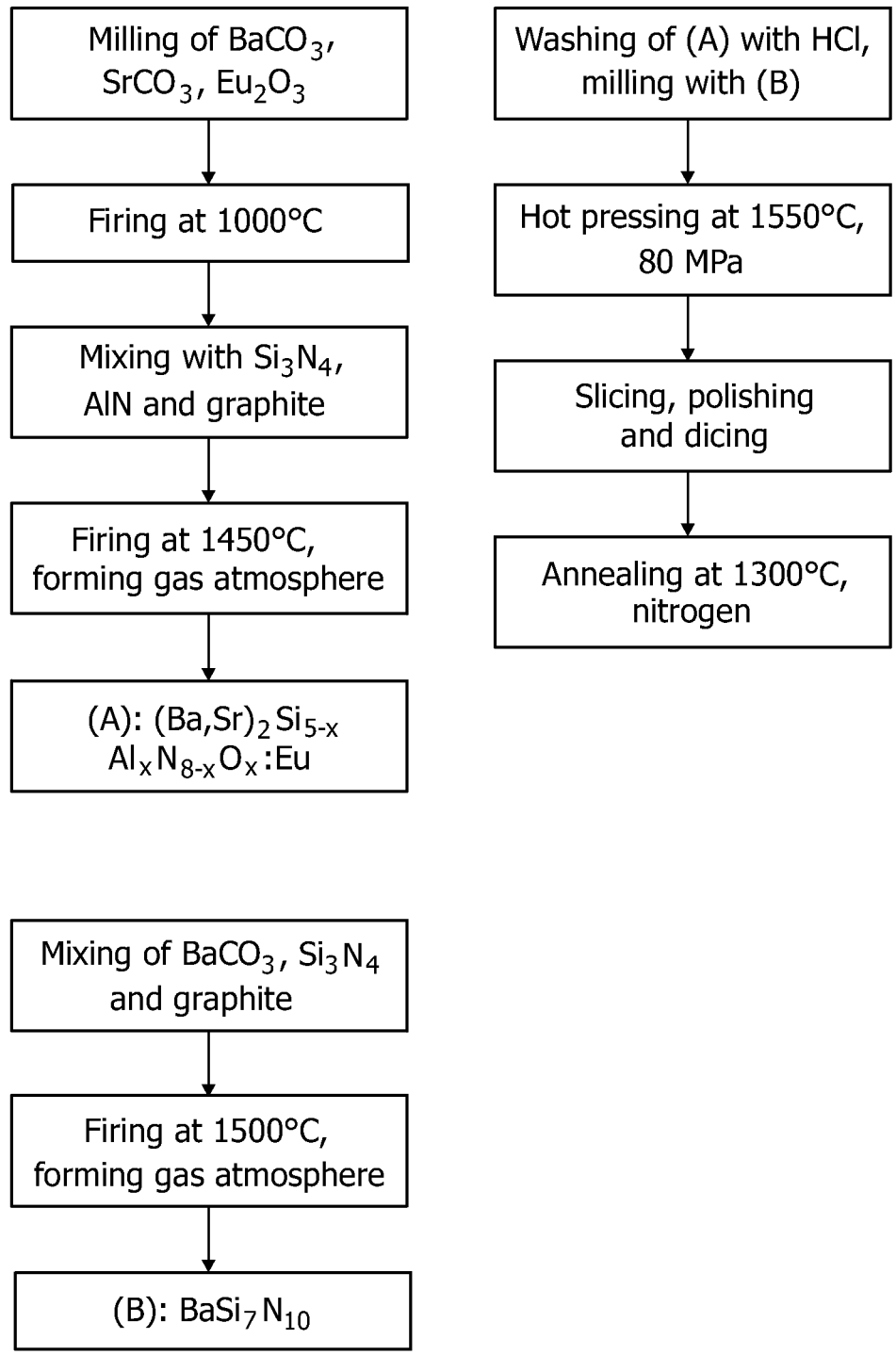
FIG. 4 is a flow diagram showing the process steps for the preparation of the composite ceramic according to the specific embodiment.

The invention claimed is:

1. An illumination system comprising a radiation source and a monolithic ceramic luminescence converter comprising a composite material comprising at least one luminescent compound comprising at least one activator in a host lattice and at least one non-luminescent compound, wherein the luminescent compound and the non-luminescent compound each comprise silicon and nitrogen and wherein the host lattice and the non-luminescent compound are different materials, wherein the luminescent compound is an amber or red-emitting europium(II)-doped alkaline earth oxonitridoaluminosilicate compound of general formula $Ba_{2-x-z}M_xSi_{5-y}Al_yN_{8-y}O_y:Eu_z$, wherein M=Sr, Ca; $0 \leq x \leq 2$, $0 \leq y \leq 4$, $0.0005 \leq z \leq 0.06$ and the non-luminescent compound is an alkaline earth oxonitridoaluminosilicate compound of general formula $Ba_{1-x}M_xSi_{7-y}Al_yN_{10-y}O_y$, wherein M=Sr, Ca, Eu; $0 \leq x \leq 1$ and $0 \leq y \leq 3$.

2. An illumination system according to claim 1, wherein the radiation source is a light emitting diode.

3. An illumination system according to claim 1, wherein the compounds additionally comprise one or more elements selected from the group of oxygen, boron, aluminum, gallium, germanium, phosphorus and carbon.

4. An illumination system according to claim 1, wherein the non-luminescent compound additionally comprises metal selected from the group of alkali metals Na, K, Rb; alkaline earth metals Be, Mg, Ca, Sr, Ba or group IIIB metals selected from the group Sc, Y, and La.

5. An illumination system according to claim 1, wherein the composite material additionally comprises a sinter-additive.

6. An illumination system according to claim 4, wherein the non-luminescent compound additionally comprises a modifier, selected from the group of transition metals Zr, Hf, Nb, Ta, W, Mo, Cr, Fe, Co, Ni, Zn, Sc, Y, La, main group elements Pb, Bi and f elements Ce, Cr, Nd, Sm, Eu, Gd, Tb, Dy, Ho, Er, Tm, Yb, Lu, Th, and U.

7. An illumination system according to claim 1, wherein the compound class of the luminescent compound and the non-luminescent compound is selected from the group of nitridosilicates, oxonitridosilicates, nitridoaluminosilicates and oxonitridoaluminosilicates.

8. An illumination system according to claim 6, wherein the at least one activator is selected from the rare earth metals cerium, praseodymium, samarium, europium, terbium, ytterbium, and manganese.

9. An illumination system comprising a radiation source and a monolithic ceramic luminescence converter comprising a composite material comprising at least one luminescent compound comprising at least one activator in a host lattice and at least one non-luminescent compound, wherein the luminescent compound and the non-luminescent compound each comprise silicon and nitrogen and wherein the host lattice and the non-luminescent compound are different materials, wherein the composite material is a particle-particle composite.

10. An illumination system according to claim 9, wherein the luminescent compound is an amber or red-emitting europium(II)-doped alkaline earth oxonitridoaluminosilicate compound of general formula $Ba_{2-x-z}M_xSi_{5-y}Al_yN_{8-y}O_y:Eu_z$, wherein M=Sr, Ca; $0 \leq x \leq 2$, $0 \leq y \leq 4$, $0.0005 \leq z \leq 0.06$ and the non-luminescent compound is an alkaline earth oxonitridoaluminosilicate compound of general formula $Ba_{1-x}M_xSi_{7-y}Al_yN_{10-y}O_y$, wherein M=Sr, Ca, Eu; $0 \leq x \leq 1$ and $0 \leq y \leq 3$.

11. An illumination system comprising a radiation source and a monolithic ceramic luminescence converter comprising a composite material comprising at least one luminescent compound comprising at least one activator in a host lattice and at least one non-luminescent compound, wherein the luminescent compound and the non-luminescent compound each comprise silicon and nitrogen and wherein the host lattice and the non-luminescent compound are different materials, wherein the composite material is a particle-matrix composite.

12. An illumination system according to claim 1, wherein the composite material is a stacked multilayer composite.

13. An illumination system according to claim 1, wherein the density of the composite material is ≥97% of the theoretical density.

14. An illumination system according to claim 9, wherein the radiation source is a light emitting diode.

15. An illumination system according to claim 9, wherein the compounds additionally comprise one or more elements selected from the group of oxygen, boron, aluminum, gallium, germanium, phosphorus and carbon.

16. An illumination system according to claim 9, wherein the non-luminescent compound additionally comprises metal selected from the group of alkali metals Na, K, Rb;

alkaline earth metals Be, Mg, Ca, Sr, Ba or group IIIB metals selected from the group Sc, Y, and La.

17. An illumination system according to claim 9, wherein the composite material additionally comprises a sinter-additive.

18. An illumination system according to claim 9, wherein the non-luminescent compound additionally comprises a modifier, selected from the group of transition metals Zr, Hf, Nb, Ta, W, Mo, Cr, Fe, Co, Ni, Zn, Sc, Y, La, main group elements Pb, Bi and f elements Ce, Cr, Nd, Sm, Eu, Gd, Tb, Dy, Ho, Er, Tm, Yb, Lu, Th, and U.

19. An illumination system according to claim 9, wherein the compound class of the luminescent compound and the non-luminescent compound is selected from the group of nitridosilicates, oxonitridosilicates, nitridoaluminosilicates and oxonitridoaluminosilicates.

20. An illumination system according to claim 9, wherein the at least one activator is selected from the rare earth metals cerium, praseodymium, samarium, europium, terbium, ytterbium, and manganese.

21. An illumination system according to claim 9, wherein the density of the composite material is ≥97% of a theoretical density.

22. An illumination system according to claim 11, wherein the radiation source is a light emitting diode.

23. An illumination system according to claim 11, wherein the compounds additionally comprise one or more elements selected from the group of oxygen, boron, aluminum, gallium, germanium, phosphorus and carbon.

24. An illumination system according to claim 11, wherein the non-luminescent compound additionally comprises metal selected from the group of alkali metals Na, K, Rb; alkaline earth metals Be, Mg, Ca, Sr, Ba or group IIIB metals selected from the group Sc, Y, and La.

25. An illumination system according to claim 11, wherein the composite material additionally comprises a sinter-additive.

26. An illumination system according to claim 11, wherein the non-luminescent compound additionally comprises a modifier, selected from the group of transition metals Zr, Hf, Nb, Ta, W, Mo, Cr, Fe, Co, Ni, Zn, Sc, Y, La, main group elements Pb, Bi and f elements Ce, Cr, Nd, Sm, Eu, Gd, Tb, Dy, Ho, Er, Tm, Yb, Lu, Th, and U.

27. An illumination system according to claim 11, wherein the compound class of the luminescent compound and the non-luminescent compound is selected from the group of nitridosilicates, oxonitridosilicates, nitridoaluminosilicates and oxonitridoaluminosilicates.

28. An illumination system according to claim 11, wherein the at least one activator is selected from the rare earth metals cerium, praseodymium, samarium, europium, terbium, ytterbium, and manganese.

29. An illumination system according to claim 11, wherein the density of the composite material is ≥97% of a theoretical density.

30. An illumination system according to claim 11, wherein the luminescent compound is an amber or red-emitting europium(II)-doped alkaline earth. oxonitridoaluminosilicate compound of general formula $Ba_{2-x-z}M_xSi_{5-y}Al_yN_{8-y}O_y$: $Eu_z$, wherein M=Sr, Ca; $0 \le x \le 2$, $0 \le y \le 4$, $0.0005 \le z \le 0.06$ and the non-luminescent compound is an alkaline earth oxonitridoaluminosilicate compound of general formula $Ba_{1-x}M_xSi_{7-y}Al_yN_{10-y}O_y$, wherein M=Sr, Ca, Eu; $0 \le x \le 1$ and $0 \le y \le 3$.

* * * * *